(12) United States Patent
Hertkorn et al.

(10) Patent No.: US 11,018,278 B2
(45) Date of Patent: May 25, 2021

(54) SEMICONDUCTOR BODY

(71) Applicant: OSRAM Opto Semiconductors GmbH, Regensburg (DE)

(72) Inventors: Joachim Hertkorn, Wörth An der Donau (DE); Marcus Eichfelder, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/488,540

(22) PCT Filed: Feb. 28, 2018

(86) PCT No.: PCT/EP2018/054906
§ 371 (c)(1),
(2) Date: Aug. 23, 2019

(87) PCT Pub. No.: WO2018/158302
PCT Pub. Date: Sep. 7, 2018

(65) Prior Publication Data
US 2020/0006594 A1  Jan. 2, 2020

(30) Foreign Application Priority Data
Mar. 2, 2017  (DE) .......................... 102017104370.5

(51) Int. Cl.
*H01L 33/14* (2010.01)
*H01L 31/0352* (2006.01)
(Continued)

(52) U.S. Cl.
CPC ........ *H01L 33/14* (2013.01); *H01L 31/03048* (2013.01); *H01L 31/035272* (2013.01); *H01L 33/32* (2013.01)

(58) Field of Classification Search
CPC ................................................. H01L 31/03048
See application file for complete search history.

(56) References Cited

U.S. PATENT DOCUMENTS 6,489,636 B1  12/2002  Goetz et al.
6,667,498 B2  12/2003  Makimoto et al.
(Continued)

FOREIGN PATENT DOCUMENTS

DE          10213395 A1   10/2002
DE      102009060747 A1    7/2011
(Continued)

*Primary Examiner* — Moazzam Hossain
*Assistant Examiner* — Mohammad A Rahman
(74) *Attorney, Agent, or Firm* — Slater Matsil, LLP

(57) ABSTRACT

A semiconductor body is disclosed. In an embodiment a semiconductor body includes a p-doped region, an active region, an intermediate layer and a layer stack containing indium, wherein an indium concentration in the layer stack changes along a stacking direction, wherein the layer stack is formed with exactly one nitride compound semiconductor material apart from dopants, wherein the intermediate layer is nominally free of indium, arranged between the layer stack and the active region, and directly adjoins the layer stack, wherein the intermediate layer and/or the layer stack are n-doped at least in places, wherein a dopant concentration of the layer stack is at least $5*10^{17}$ $1/cm^3$ and at most $2*10^{18}$ $1/cm^3$, and wherein a dopant concentration of the intermediate layer is at least $2*10^{18}$ $1/cm^3$ and at most $3*10^{19}$ $1/cm^3$.

5 Claims, 3 Drawing Sheets

(51) Int. Cl.
*H01L 31/0304* (2006.01)
*H01L 33/32* (2010.01)

(56) References Cited

U.S. PATENT DOCUMENTS

| | | |
|---|---|---|
| 8,053,756 B2 | 11/2011 | Nakahara et al. |
| 8,357,924 B2 | 1/2013 | Kim et al. |
| 8,519,437 B2 | 8/2013 | Chakraborty |
| 8,536,615 B1 | 9/2013 | Driscoll et al. |
| 9,012,888 B2 | 4/2015 | Kushibe et al. |
| 9,660,137 B2 | 5/2017 | Bergbauer et al. |
| 9,761,576 B2 | 9/2017 | Butendeich et al. |
| 9,774,169 B2 | 9/2017 | Nakatsu |
| 9,799,797 B2 | 10/2017 | Peter et al. |
| 2002/0171091 A1* | 11/2002 | Goetz ................ H01S 5/32341 257/103 |
| 2010/0133506 A1 | 6/2010 | Nakanishi et al. |
| 2012/0319126 A1* | 12/2012 | Butendeich ............ H01L 33/08 257/76 |
| 2013/0026484 A1 | 1/2013 | Walukiewicz et al. |
| 2013/0105817 A1* | 5/2013 | Saunier ................ H01L 29/7787 257/77 |

FOREIGN PATENT DOCUMENTS

| | | |
|---|---|---|
| JP | 2003059938 A | 2/2003 |
| JP | 2009071277 A | 4/2009 |
| JP | WO2007138658 A1 | 10/2009 |
| JP | WO2008153130 A1 | 8/2010 |
| JP | 2013065630 A | 4/2013 |
| JP | 2013516781 A | 5/2013 |
| JP | 2015511776 A | 4/2015 |
| JP | 2016224862 A | 12/2016 |
| JP | 2018050021 A | 3/2018 |
| KR | 20080045943 A | 5/2008 |
| WO | 2011080219 A1 | 7/2011 |
| WO | 2014198550 A1 | 12/2014 |
| WO | 2016129493 A1 | 8/2016 |

* cited by examiner

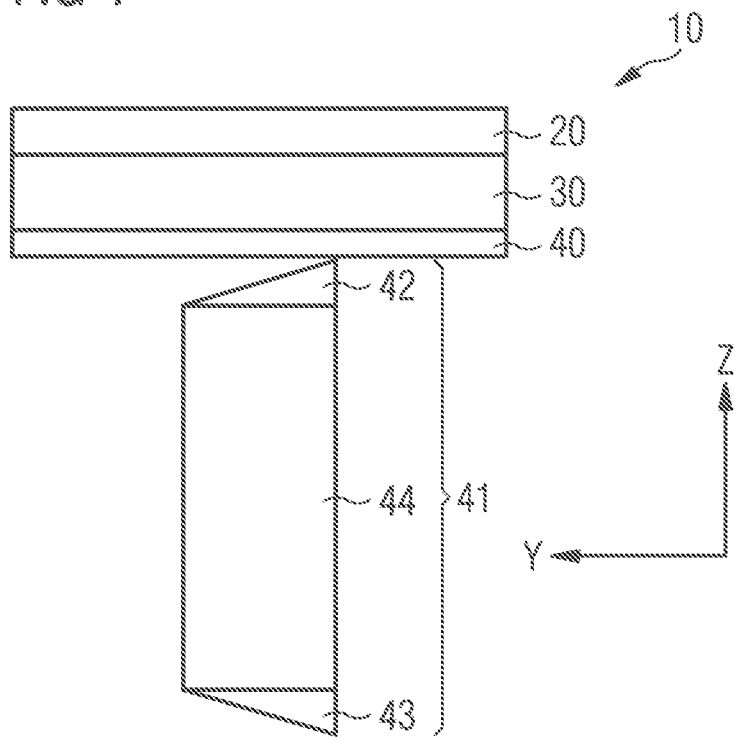
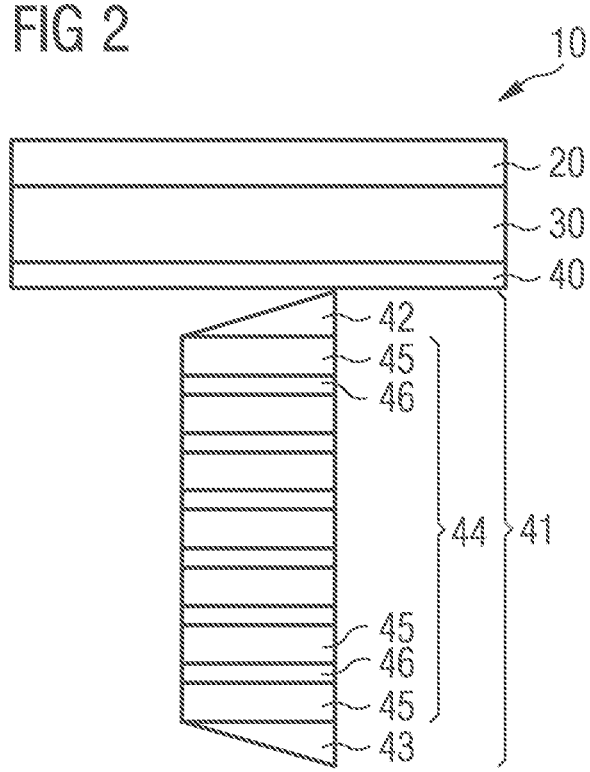

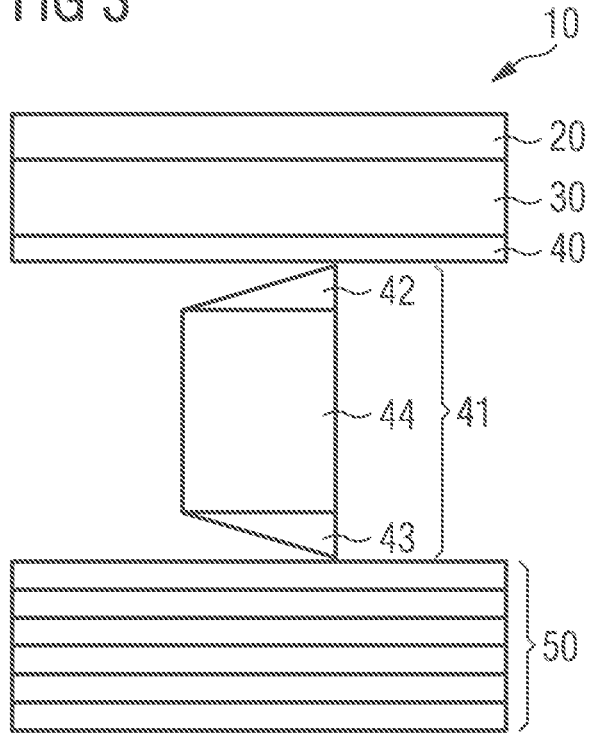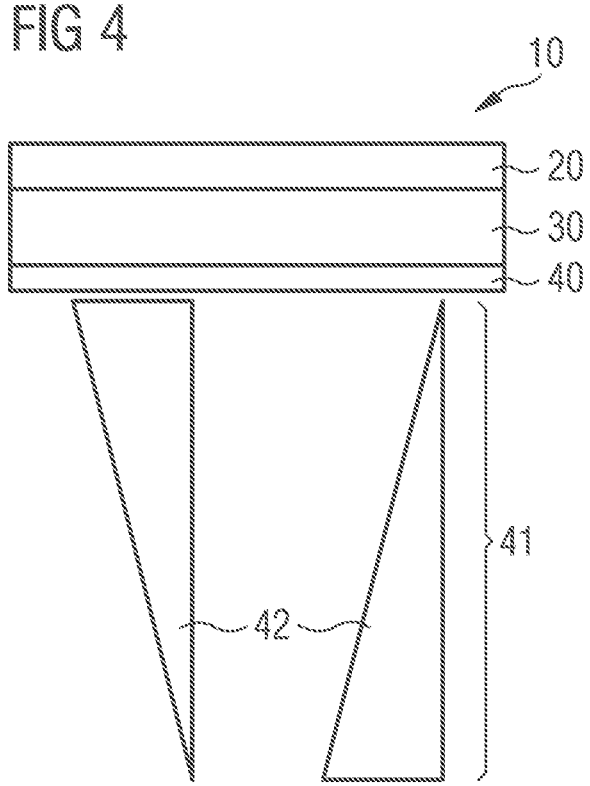

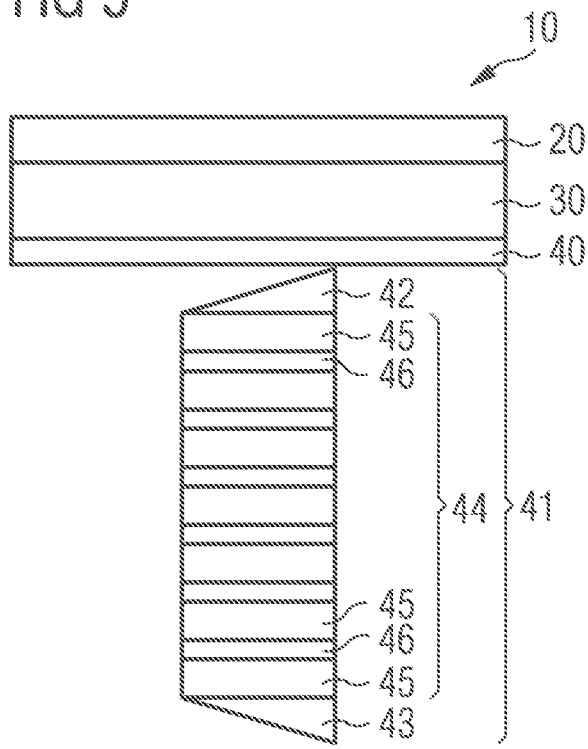
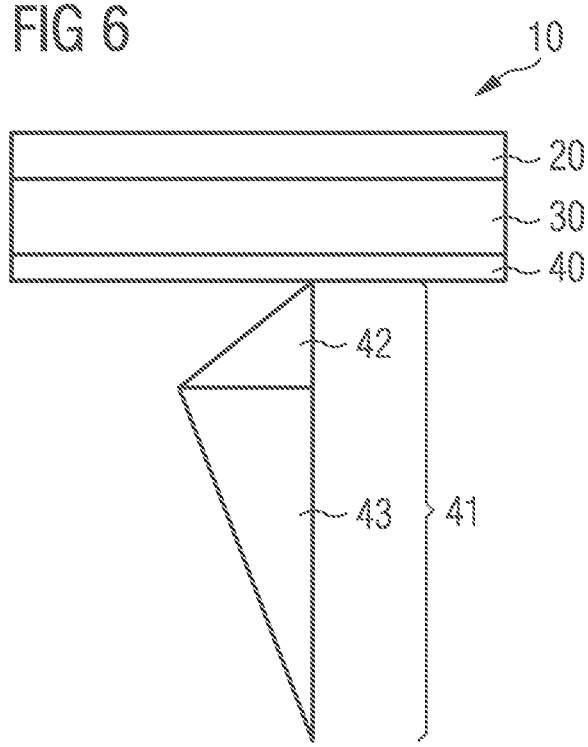

SEMICONDUCTOR BODY

This patent application is a national phase filing under section 371 of PCT/EP2018/054906, filed Feb. 28, 2018, which claims the priority of German patent application 102017104370.5, filed Mar. 2, 2017, each of which is incorporated herein by reference in its entirety.

TECHNICAL FIELD

The present disclosure refers to a semiconductor body that can be efficiently operated and manufactured.

SUMMARY OF THE INVENTION

Embodiments provide a semiconductor body in particular an III/V compound semiconductor material. Further embodiments provide a semiconductor body based on a nitride compound semiconductor material.

According to at least one embodiment of the semiconductor body, the semiconductor body comprises a p-doped region. The p-doped region is doped with at least one p-dopant. The p-doped region may comprise one or more p-doped semiconductor layers. Furthermore, the p-doped region can extend over the entire lateral extent of the semiconductor body. The lateral extent of the semiconductor body is transverse, in particular perpendicular, to a stacking direction of the semiconductor body.

According to at least one embodiment, the semiconductor body comprises an active region. The p-doped region can be arranged on the active region. In the active region, a function of the semiconductor body is performed during operation. For example, the active region may be configured to emit or detect electromagnetic radiation. The semiconductor body is then part of an optoelectronic component. The active region may, for example, comprise a plurality of alternately arranged quantum well layers and barrier layers. It is also possible that the semiconductor body is part of an electronic component such as a diode, a transistor or an integrated circuit. The active region is then designed appropriately.

According to at least one embodiment, the semiconductor body comprises an intermediate layer. The intermediate layer can directly adjoin the active region and the active region can be grown on the intermediate layer. The intermediate layer can be formed with a semiconductor material. For example, the intermediate layer can be formed with a nitride compound semiconductor material such as gallium nitride (GaN). The material composition of the nitride compound semiconductor material does not change within the intermediate layer, especially within the limits of a manufacturing tolerance.

According to at least one embodiment, the semiconductor body comprises a layer stack containing indium, the indium concentration in the layer stack changing along the stacking direction, and the layer stack being formed with exactly one nitride compound semiconductor material apart from dopants. For example, exactly one nitride compound semiconductor material means that the layer stack may contain impurities or foreign atoms with a concentration of less than 5%. The layer stack preferably contains impurities or foreign atoms with a concentration of less than 1%. The intermediate layer can be applied to, e.g., grown on the layer stack. The layer stack can comprise different semiconductor layers. Thus, the layer stack can be formed with a semiconductor material containing indium.

The stacking direction of the semiconductor body corresponds to the stacking direction of the layer stack. The indium concentration in the layer stack is not constant along the stacking direction. This means that the indium concentration in the layer stack can increase or decrease in the stacking direction, for example. It is possible that the indium concentration in the layer stack changes linearly or in some other way. Preferably, the indium concentration in the layer stack changes quasi-continuously or continuously. For example, the temperature or the supply of indium can be changed quasi-continuously or continuously during the growth of the layer stack. In lateral directions, the indium concentration in the layer stack can be constant.

The layer stack is formed with a nitride compound semiconductor material. This means that the entire layer stack is formed with the same semiconductor material and that different regions of the layer stack differ only in their indium concentration and possibly in their dopant concentration. For example, the layer stack can be formed with indium gallium nitride (InGaN).

The fact that the layer stack contains indium prevents or at least reduces the undesirable incorporation and thus the concentration of impurities in the active region. This allows the semiconductor body to be operated more efficiently.

Due to the fact that the layer stack is formed with exactly one nitride compound semiconductor material, the semiconductor body can be easily manufactured. In addition, the layer stack can contribute to protection against electrostatic discharge.

According to at least one embodiment of the semiconductor body, the intermediate layer is nominally free of indium and arranged between the layer stack and the active region, and the intermediate layer directly adjoins the layer stack. In this case, the fact that the intermediate layer is nominally free of indium means in particular that no indium is provided during the growth of the intermediate layer. However, it cannot be excluded that indium from adjacent layers diffuses into the intermediate layer. The layer stack, the intermediate layer and the active region are arranged one above the other in the stacking direction and can each extend over the entire lateral extent of the semiconductor body.

According to at least one embodiment of the semiconductor body, the intermediate layer and/or the layer stack are n-doped at least in places. It is therefore possible that the intermediate layer and the layer stack are partially or completely n-doped. For example, individual layers of the layer stack can be n-doped and other layers can be undoped. The intermediate layer and the layer stack can, for example, be doped with silicon.

For example, the dopant concentration in the intermediate layer and/or in the layer stack may be at least $5*10^{17}$ $1/cm^3$ and at most $2*10^{18}$ $1/cm^3$. It is also possible that the dopant concentration of the intermediate layer is between $2*10^{18}$ $1/cm^3$ and $3*10^{19}$ $1/cm^3$. It is also possible that the layer stack has regions where the dopant concentration is at least $2*10^{18}$ $1/cm^3$ and at most $3*10^{19}$ $1/cm^3$. The thickness in the stacking direction of these higher doped areas can be between 5 Å and 30 Å. A high dopant concentration in regions of the intermediate layer and/or a high dopant concentration in regions of the layer stack can provide protection against electrostatic discharge. Thus, the failure rate of the semiconductor body during electrostatic charging can be reduced.

The semiconductor body can be grown on a substrate. The semiconductor body can be epitaxially grown on a substrate by metal-organic vapor phase epitaxy. It is also possible that the semiconductor body is free of a growth substrate and is located on a carrier element which is subsequently attached to the semiconductor body after growth. Thus, the semiconductor body can be a thin-film semiconductor body from which the growth substrate is removed.

The p-doped region, the active region, the intermediate layer and the layer stack can form three-dimensional bodies and be cuboid or cylindrical, for example.

According to at least one embodiment, the semiconductor body comprises a p-doped region, an active region, an intermediate layer and a layer stack. The layer stack contains indium, the indium concentration in the layer stack changing along a stacking direction. In addition, apart from dopants, the layer stack is formed with exactly one nitride compound semiconductor material. The intermediate layer is nominally free of indium, arranged between the layer stack and the active region and directly adjoins the layer stack. The intermediate layer and/or the layer stack are n-doped at least in places.

The semiconductor body described here is based, among other things, on the observation that the semiconductor body can be produced efficiently and cost-effectively because the layer stack is formed with only one material. The semiconductor body can also be operated efficiently because the layer stack is formed with indium. It has been shown that the use of indium in the layer stack prevents or at least reduces the undesirable incorporation of impurities into the active region.

According to at least one embodiment, a first region of the layer stack directly adjoins the intermediate layer and the indium concentration decreases in the first region in the direction of the intermediate layer. The first region of the layer stack can extend in lateral directions over the entire lateral extent of the semiconductor body. The first region may include a plurality of semiconductor layers. The indium concentration in the first region decreases in the direction of the intermediate layer, so that the indium concentration in the first region decreases to a minimum value at the interface to the intermediate layer. The indium concentration can decrease continuously in the first region. Preferably the indium concentration in the first region decreases to a minimum value of <1%. The indium concentration in the first region is particularly preferred to decrease to a minimum value of <0.5%. If, for example, the layer stack is formed with $In_xGaN$, x is preferably smaller than 1% and particularly preferably smaller than 0.5%.

If a semiconductor layer containing indium and formed, for example, with InGaN is grown on a semiconductor layer containing no indium and formed, for example, with GaN, the failure rate of the semiconductor body under electrostatic load may be increased. According to this embodiment, the indium concentration at the interface between the layer stack and the intermediate layer advantageously decreases to a minimum value. The continuous lowering of the indium concentration prevents the formation of an interface at which the indium concentration changes significantly.

Since the materials InGaN and GaN have different lattice constants, tensions arise in the material when the two materials are grown on top of each other. These tensions result in piezoelectric fields. Thus, at an interface between a layer formed with InGaN and another layer formed with GaN, piezo charges can accumulate. It has been shown that these can negatively influence the failure rate of the semiconductor body during electrostatic charging. Thus, increased protection against electrostatic discharge can be achieved by avoiding interfaces at which the indium concentration changes significantly.

According to at least one embodiment, a second region of the layer stack is arranged on the side of the layer stack facing away from the first region, and the indium concentration in the second region increases in the direction of the intermediate layer. The second region can extend over the entire lateral extent of the semiconductor body. The first and second regions are arranged one above the other in the stacking direction. However, they do not necessarily directly adjoin each other. The second region may include a plurality of semiconductor layers. The indium concentration in the second region increases in the stacking direction. Preferably, the indium concentration in the second region increases from a minimum value of <1% or particularly preferably from <0.5% to over a threshold value of 1.5%. Particularly preferably, the threshold value is at least 2% and at most 4.9%. The indium concentration can increase continuously. If the second region adjoins a layer outside the layer stack which is formed with GaN, the formation of piezo charges at the interface is prevented.

According to at least one embodiment, the indium concentration in the second region of the layer stack increases at least to a threshold value in the direction of the intermediate layer and decreases below the threshold value again in the region of the layer stack only within the first region. This means that the indium concentration in the layer stack is lower than the threshold value only within the first and second regions. Between the first and second regions there may be a third region in which the indium concentration is above the threshold value. The first and second regions can each have a layer thickness of less than 5 nm. Since the layer stack is formed with only one nitride compound semiconductor material, piezo charges are not formed within the layer stack either.

According to at least one embodiment, the first and second regions of the layer stack are n-doped and the third region is undoped.

According to at least one embodiment, the second region of the layer stack directly adjoins the first region of the layer stack. In this case, the layer stack does not have a third region. In this exemplary embodiment, it is possible that the first and second regions have different thicknesses in the stacking direction. For example, the first region may be much thinner than the second region. For example, the thickness of the second region is two to 20 times greater than the thickness of the first region. Preferably the thickness of the second region is three to four times the thickness of the first region.

According to at least one embodiment, the indium concentration in the layer stack decreases in the direction of the intermediate layer. This means that the indium concentration in the layer stack does not increase in the direction of the intermediate layer, but only decreases. The indium concentration in the layer stack can decrease continuously in the direction of the intermediate layer. If the indium concentration in the layer stack decreases at the interface to the intermediate layer to a minimum value of <1% or preferably <0.5%, the formation of piezo charges at the interface is prevented. Since in this exemplary embodiment the layer stack has only one region, the manufacturing process of the semiconductor body can be simplified.

According to at least one embodiment, the indium concentration in the layer stack increases in the direction of the intermediate layer. This means that the indium concentration in the layer stack does not decrease in the direction of the intermediate layer, but only increases. The indium concentration in the layer stack can increase continuously in the direction of the intermediate layer. In order to reduce the formation of piezo charges at the interface between the layer stack and the intermediate layer, the intermediate layer can be highly n-doped. This means, for example, that the dopant concentration is at least $2*10^{18}$ 1/cm³ and at most $3*10^{19}$ 1/cm³.

According to at least one embodiment, the layer stack comprises at least one pair of alternating layers, a first layer of each pair being n-doped and a second layer of each pair being nominally undoped. The alternating layers are arranged between the first and the second region of the layer stack. The indium concentration in the alternating layers can be constant. The first layer of each pair can be n-doped with silicon, for example. The fact that the second layer of each pair is nominally undoped means that no dopant is provided during the growth of the second layer. However, it is possible that dopants from adjacent layers are incorporated into the second layer. However, the second layer has a dopant concentration that is significantly lower than the dopant concentration in the adjacent layers. For example, the dopant concentration in the second layer is at most $5*10^{16}$ 1/cm³. The layer stack preferably comprises a plurality of pairs of alternating layers. The alternating layers can contribute to improved protection against electrostatic discharge.

According to at least one embodiment, the first layer of each pair has a different indium concentration than the second layer of each pair. The first and the second layer thus each have a constant indium concentration. The indium concentration in the first layer can be either higher or lower than the indium concentration in the second layer. For example, the difference between the absolute indium concentrations in the first and second layers can be one percent. For example, the indium concentration can be 2% in the first layer and 3% in the second layer.

According to at least one embodiment, the layer stack is arranged between the intermediate layer and a layer sequence and the layer sequence is nominally free of indium. The layer sequence can comprise a plurality of semiconductor layers. In addition, the layer sequence can directly adjoin the layer stack. This means that the layer sequence, the layer stack and the intermediate layer are arranged one above the other in the stacking direction. The fact that the layer sequence is nominally free of indium means that no indium is provided during the growth of the layer sequence. However, it is possible that indium from adjacent layers is incorporated into the layer sequence.

The layer sequence is designed to contribute to better protection against electrostatic discharge. For this purpose, existing dislocations are specifically used. A current pulse can then flow off over the unevenness in the layer sequence caused by the dislocations without damaging the active region. This allows the failure rate of the semiconductor body to be reduced during electrostatic charging. Such a layer sequence is described in connection with a first semiconductor layer sequence in the publication WO 2011080219 A1, the disclosure content of which is hereby incorporated by reference.

According to at least one embodiment, the active region is designed for the generation or detection of electromagnetic radiation, in particular light. The semiconductor body can, for example, be a light-emitting diode. For example, the light-emitting diode can emit electromagnetic radiation in a certain spectral range.

According to at least one embodiment, the layer thickness of the layer stack in the stacking direction is at least 5 nm and at most 150 nm. The preferred layer thickness of the layer stack is at least 15 nm. Particularly preferably, the layer thickness of the layer stack is at least 30 nm and at most 90 nm. For example, the layer thickness of the layer stack can be 60 nm. Advantageously, the layer thickness of the layer stack is selected such that a relaxation of the layer stack can be prevented and thus the formation of crystal defects is minimized.

According to at least one embodiment, the layer thickness of the layer stack in the stacking direction is less than 20 nm. The preferred layer thickness of the layer stack is at least 5 nm and less than 20 nm. Advantageously, the formation of crystal defects is greatly reduced with such a small thickness of the layer stack.

According to at least one embodiment, the indium concentration in the layer stack is lower than 5%. Preferably, the indium concentration in the layer stack is lower than 3%. Particularly preferably, the indium concentration in the layer stack is approximately 2.7%. Since the indium concentration in the layer stack is relatively low, the layer stack can be grown with a high quality. This means, for example, that less tension occurs in the layer stack.

BRIEF DESCRIPTION OF THE DRAWINGS

In the following, semiconductor bodies described here are explained in more detail in connection with exemplary embodiments and the corresponding figures.

FIG. 1 shows a schematic cross-section through a semiconductor body according to an exemplary embodiment.

FIGS. 2 to 6 show schematic cross-sections through a semiconductor body according to further exemplary embodiments.

Identical, similar or equivalent elements are provided with the same reference signs in the figures. The figures and the proportions of the elements depicted in the figures are not to be regarded as true to scale. Rather, individual elements may be represented exaggeratedly large for better representability and/or better comprehensibility.

DETAILED DESCRIPTION OF ILLUSTRATIVE EMBODIMENTS

FIG. 1 shows a schematic cross-section through a semiconductor body 10. The semiconductor body 10 comprises a layer stack 41, to which an intermediate layer 40 is applied. An active region 30 is applied to the intermediate layer 40. In addition, the semiconductor body 10 comprises a p-doped region 20 applied to the active region 30.

The layer stack 41 has a first region 42, which directly adjoins the intermediate layer 40. Furthermore, the layer stack 41 has a second region 43 which is arranged on the side of the layer stack 41 facing away from the first region 42. Between the first region 42 and the second region 43 there is a third region 44. The layer stack 41 is formed with exactly one nitride compound semiconductor material apart from dopants. One nitride compound semiconductor material means that the layer stack may contain impurities or foreign atoms with a concentration of less than 5%. The layer stack preferably contains impurities or foreign atoms with a concentration of less than 1%. The layer stack 41 also contains indium.

The indium concentration in the layer stack 41 is not constant. In the second region 43 the indium concentration increases to above a threshold value in a stacking direction z. The stacking direction z is perpendicular to the lateral extent of the semiconductor body 10. Preferably, the indium concentration in the second region 43 increases from a minimum value of <1% or preferably <0.5% to above the threshold value. FIG. 1 shows the stacking direction z of the semiconductor body 10 on the z-axis and the indium concentration in the layer stack 41 on the y-axis. Thus, the indium concentration increases continuously in the second region 43. In the third region 44 of the layer stack 41, the indium concentration is constant. In the first region 42 of the layer stack 41, the indium concentration decreases below the threshold value again. In this case the indium concentration decreases continuously. Preferably the indium concentration in the first region 42 decreases to a minimum value of <1% or preferably <0.5%. For example, the threshold value of the indium concentration may be at least 1.5% and at most 4.9%. Preferably, the threshold value is at least 2% and at most 3%. Since the indium concentration is relatively low, the layer stack 41 can be grown with an improved quality, i.e., with less tensions and dislocations.

For example, the indium concentration can be changed in the first region 42 and in the second region 43 by changing the temperature, growth rate or pressure during the growth of the stack 41 and the supply of indium.

The layer stack 41 can be formed with InGaN, for example, and be n-doped at least in places. For example, the layer stack 41 can be doped with silicon.

The layer stack 41 may have a thickness of at least 5 nm and at most 150 nm. The first region 42 and the second region 43 can each have a thickness of less than 5 nm.

The intermediate layer 40 directly adjoins the layer stack 41 and is arranged between the layer stack 41 and the active region 30. The intermediate layer 40 is nominally free of indium. This means that no indium is provided during the growth of the intermediate layer 40. However, it is possible that indium from adjacent layers is incorporated into the intermediate layer 40. The intermediate layer 40 can be formed with GaN. In addition, the intermediate layer 40 can be n-doped in partial areas. The dopant concentration in the intermediate layer 40 may be at least $2*10^{18}$ 1/cm$^3$ and at most $3*10^{19}$ 1/cm$^3$. The layer stack 41 can also have regions or layers in which the dopant concentration lies within this range.

If a layer containing indium adjoins a layer containing no indium, piezo charges may form at the interface between the two layers. In this exemplary embodiment, the formation of piezo charges is prevented by the fact that the indium concentration in the first region 42 decreases to a very low value. This prevents the formation of piezo charges at the interface between the layer stack 41 and the intermediate layer 40. In addition, the formation of piezo charges at the interface between the second region 43 and underlying layers, which do not belong to the layer stack 41, is prevented.

The active region 30 directly adjoins the intermediate layer 40 and is grown on the same. The active region 30 may be designed for generating or detecting electromagnetic radiation, in particular light. For example, the active region 30 may comprise a multiple quantum well structure comprising a plurality of alternately arranged quantum well layers and barrier layers. The barrier layers can be formed with GaAlN, InGaN or GaN and the quantum well layers can be formed with InAlGaN or InGaN. The p-doped region 20 is arranged on the active region 30.

Due to the fact that the layer stack 41 contains indium, the undesirable incorporation and thus the concentration of impurities in the active region 30 can be reduced. Thus, the semiconductor body 10 can be operated more efficiently.

Due to the fact that the layer stack 41 is formed with exactly one nitride compound semiconductor material, the semiconductor body 10 can be easily manufactured. In addition, the semiconductor body 10 is more robust than a semiconductor body manufactured with a larger number of different materials.

FIG. 2 shows a schematic cross-section through a semiconductor body 10 according to another exemplary embodiment. The structure of the semiconductor body 10 corresponds to the structure shown in FIG. 1. In this exemplary embodiment, however, the third region 44 of the layer stack 41 has pairs of alternating layers. A first layer 45 of each pair is n-doped and a second layer 46 of each pair is nominally undoped. The first layers 45 can be doped with silicon, for example. The fact that the second layers 46 are nominally undoped means that no dopant is provided during the growth of the second layers 46. However, it is possible that dopants from adjacent layers are incorporated into the second layers 46.

FIG. 3 shows a schematic cross-section through a semiconductor body 10 according to another exemplary embodiment. The structure of the semiconductor body 10 corresponds to the structure shown in FIG. 1. In addition, the semiconductor body 10 has a layer sequence 50. The layer stack 41 is arranged between the intermediate layer 40 and the layer sequence so and the layer sequence so is nominally free of indium. The layer sequence so can be formed with GaN and contribute to the protection against electrostatic discharge. For this purpose, existing dislocations in the layer sequence 50 are specifically used. A current pulse can then flow off over the unevenness in the layer sequence 50 caused by the dislocations without damaging the active region 30. Thus, the failure rate of the semiconductor body 10 can be reduced during electrostatic charging. Advantageously, no piezo charges form at the interface between the layer stack 41 and the layer sequence 50 because the indium concentration in the second region 43 is very low at the interface.

FIG. 4 shows a schematic cross-section through a semiconductor body 10 according to another exemplary embodiment. In the area of the layer stack 41, two alternative solutions are shown. In the first case, which is shown on the left, the indium concentration in the layer stack 41 increases continuously in the direction of the intermediate layer 40. Hence, in this case, the layer stack 41 only has a first region 42. At the interface to the intermediate layer 40, the indium concentration in the layer stack 41 is at its maximum. In order to at least reduce the formation of piezo charges at the interface, the intermediate layer 40 can be partially highly n-doped. In the second case, which is shown on the right, the indium concentration in the layer stack 41 decreases in the direction of the intermediate layer 40. At the interface to the intermediate layer 40, the indium concentration in the layer stack 41 is at its minimum. This prevents the formation of piezo charges at this interface. Since in this exemplary embodiment the layer stack 41 only has a first region 42, the semiconductor body 10 can be manufactured particularly easily.

FIG. 5 shows a schematic cross-section through a semiconductor body 10 according to another exemplary embodiment. The structure of the semiconductor body 10 corresponds to the structure shown in FIG. 2. In this case, the first layers 45 and the second layers 46 differ not only in that the first layers 45 are n-doped and the second layers 46 are undoped, but also in that the first layers 45 have a different indium concentration than the second layers 46. The indium concentration is the same in all first layers 45 and differs from the indium concentration of the second layers 46. The indium concentration is also the same in all second layers 46. The indium concentration in the first layers 45 can therefore either be higher or lower than the indium concentration in the second layers 46. For example, the difference between the indium concentrations of the first layers 45 and the second layers 46 can be one percent.

FIG. 6 shows a schematic cross-section through a semiconductor body 10 according to another exemplary embodiment. The structure of the semiconductor body 10 corresponds to the structure shown in FIG. 1. In contrast to FIG. 1, the layer stack 41 in this exemplary embodiment has only a first region 42 and a second region 43. The first region 42 directly adjoins the second region 43. The thickness of the second region 43 in the stacking direction z is considerably greater than the thickness of the first region 42. For example, the thickness of the second region 43 is two to 20 times greater than the thickness of the first region 42. Preferably, the thickness of the second region 43 is three to four times greater than the thickness of the first region 42.

The invention is not limited to the exemplary embodiments by the description using the same. Rather, the invention includes any new feature and any combination of features, which in particular includes any combination of features in the patent claims, even if that feature or combination itself is not explicitly mentioned in the patent claims or exemplary embodiments.

The invention claimed is:

1. A semiconductor body comprising:
   a p-doped region;
   an active region;
   an intermediate layer; and
   a layer stack containing indium,
   wherein an indium concentration in the layer stack changes along a stacking direction,
   wherein the layer stack is formed with exactly one nitride compound semiconductor material apart from dopants,
   wherein the intermediate layer is nominally free of indium, arranged between the layer stack and the active region, and directly adjoins the layer stack,
   wherein the intermediate layer and/or the layer stack are n-doped at least in places, and
   wherein an indium concentration in a second region of the layer stack increases at least to a threshold value in a direction of the intermediate layer and decreases below the threshold value again in the layer stack only within a first region.

2. The semiconductor body according to claim 1, wherein the second region of the layer stack directly adjoins the first region of the layer stack.

3. The semiconductor body according to claim 1, wherein the active region is configured to generate or detect electromagnetic radiation.

4. The semiconductor body according to claim 1, wherein a layer thickness of the layer stack in the stacking direction is at least 5 nm and less than 20 nm.

5. The semiconductor body according to claim 1, wherein the indium concentration in the layer stack is less than 5%.

* * * * *